United States Patent [19]

Emori et al.

[11] Patent Number: 4,587,444

[45] Date of Patent: May 6, 1986

[54] VARIABLE-THRESHOLD-TYPE DIFFERENTIAL SIGNAL RECEIVER

[75] Inventors: Shinji Emori, Urawa; Yoshio Watanabe, Kawasaki, both of Japan

[73] Assignee: Fujitsu Limited, Kawasaki, Japan

[21] Appl. No.: 513,057

[22] Filed: Jul. 12, 1983

[30] Foreign Application Priority Data

Jul. 13, 1982 [JP] Japan .................................. 57-122575

[51] Int. Cl.[4] ...................... H03K 5/24; H03K 19/003; H03K 19/086
[52] U.S. Cl. .................................... 307/355; 307/356; 307/359; 307/443; 307/455; 330/261
[58] Field of Search ............... 307/355, 356, 359, 362, 307/455, 494, 498, 442, 443; 330/261

[56] References Cited

U.S. PATENT DOCUMENTS

| | | | |
|---|---|---|---|
| 3,467,839 | 9/1969 | Miller | 307/455 X |
| 3,470,388 | 9/1969 | Scarpa | 307/355 |
| 3,577,008 | 5/1971 | Craft | 307/362 X |
| 3,626,214 | 12/1971 | Wesner | 307/359 X |

FOREIGN PATENT DOCUMENTS

78612  6/1980  Japan .................................. 330/261

*Primary Examiner*—Larry N. Anagnos
*Attorney, Agent, or Firm*—Staas & Halsey

[57] ABSTRACT

A variable-threshold-type differential signal receiver comprises a differential amplifier for comparing differential voltages of differential input signals with a predetermined threshold voltage so as to provide logical output signals. It further comprises an emitter follower and an impedance means, the output of the emitter follower being superimposed through the impedance means on one of the differential input signals, whereby the predetermined threshold voltage is variably controlled by controlling the input voltage of the first emitter follower.

10 Claims, 8 Drawing Figures

VARIABLE-THRESHOLD-TYPE DIFFERENTIAL SIGNAL RECEIVER

BACKGROUND OF THE INVENTION (1) Field of the Invention

The present invention relates to a variable-threshold-type differential signal receiver and more particularly to a differential signal receiver useful in a data transfer system of, for example, a Local Area network (usually referred to as a LAN), in which the threshold voltage for providing logical outputs is made variable.

(2) Description of the Prior Art

A differential-type signal receiver including a differential amplifier is known. The differential-type signal receiver receives differential input signals having a differential voltage and determines whether the differential voltage is high or not with respect to a predetermined threshold voltage so as to provide logical output signals corresponding to the differential voltage of the above-mentioned differential input signals. The differential input signals ae usually transmitted through a transformer and a pair of transmission lines connected to the secondary wiring of the transformer to the differential-type signal receiver. The differential input signals, such as a packet in the LAN, consist of a series of a high-potential signal and a low-potential signal when a signal is transmitted through the transformer. That is, the waveforms of the received input signals have edges. Whether the differential voltage is high or not is determined by detecting the edges of the waveforms of the input signals.

Conventionally, the predetermined threshold voltage of a differential-type signal receiver is usually fixed to be zero volts. This causes a problem in that, when no signal is transmitted through the transformer to the differential-type signal receiver, the input signals are zero volts and have no edge. Therefore, the differential-type signal receiver cannot determine whether the input signals have a high potential or a low potential with respect to a threshold voltage of zero volts. In this case, the output of the differential-type signal receiver may oscillate or may be easily influenced by noises, causing the output signal of the differential-type signal receiver to be indefinite. When a unit receives an indefinite signal from the output of the differential-type signal receiver, the unit may malfunction.

Therefore, it is preferable to make the differential-type signal receiver output a constant "1" or "0" level signal when it receives a zero-volts signal.

SUMMARY OF THE INVENTION

Accordingly, an object of the present invention is to provide a variable-threshold-type differential signal receiver having a variable threshold voltage for providing logical outputs.

Another object of the present invention is to provide a variable-threshold-type differential signal receiver which can output a constant "1" or "0" level signal when it receives a zero-volts signal.

Still another object of the present invention is to provide a variable-threshold-type differential signal receiver having a high noise margin.

To attain the above objects, there is provided, according to the present invention, a variable-threshold-type-differential signal receiver comprising a differential amplifier for comparing differential voltages of differential input signals with a predetermined threshold voltage so as to provide logical output signals. The differential signal receiver further comprises an emitter follower and an impedance means, the output of the emitter follower being superimposed through the impedance means on one of the differential input signals, whereby the predetermined threshold voltage is variably controlled by controlling the input voltage of the first emitter follower.

BRIEF DESCRIPTION OF THE DRAWINGS

The above objects and advantages as well as other features of the present invention will be more apparent from the following description of the preferred embodiments when read in conjunction with the accompanying drawings, wherein.

DESCRIPTION OF THE PREFERRED EMBODIMENTS

The embodiments of the present invention will now be described with reference to the drawings.

Figure 1:
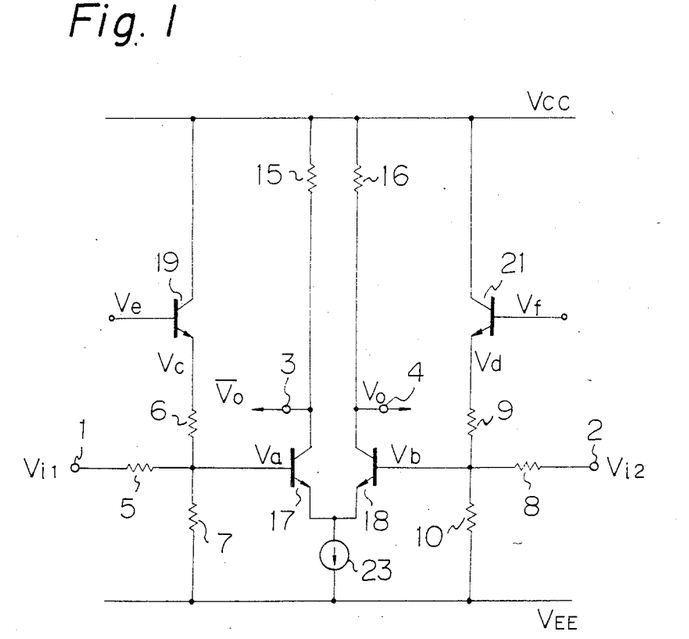
FIG. 1 is a circuit diagram of a variable-threshold-type differential signal receiver according to a first embodiment of the present invention.

FIG. 1 is a circuit diagram of a variable-threshold-type-differential signal receiver according to a first embodiment of the present invention. In the figure, a well-known differential amplifier is constructed with NPN transistors 17 and 18, resistors 15 and 16 connected between the collectors of the transistors 17 and 18 and a high-voltage power supply line $V_{CC}$, and a constant-current source 23 connected between the emitters of the transistors 17 and 18 and a low-voltage power supply line $V_{EE}$. According to the present invention, emitter-follower transistors 19 and 21 and impedance means including resistor networks of resistors 5, 6, and 7 and 8, 9, and 10 are provided. An input terminal 1 is connected through the resistor 5 to the base of the transistor 17. The resistor 6 is connected between the emitter of the transistor 19 and the base of the transistor 17. The resistor 7 is connected between the base of the transistor 17 and the low-voltage power supply line $V_{EE}$. The collector of the transistor 19 is connected to the high-voltage power supply line $V_{CC}$. Another input terminal 2 is connected through the resistor 8 to the base of the transistor 18. The resistor 9 is connected between the emitter of the transistor 21 and the base of the transistor 18. The resistor 10 is connected between the base of the transistor 18 and the low-voltage power supply line $V_{EE}$. The collector of the transistor 21 is connected to the high-voltage power supply line $V_{CC}$. The variable-threshold-type differential signal receiver receives at its input terminals 1 and 2 differential input signals and provides at its output terminals 3 and 4 logical output signals. The output voltages $V_0$ and $\overline{V}_0$ at the output terminals are determined depending on whether the transistors 17 and 18 are in an on or off state. Whether the transistors 17 and 18 are in an on or off state is determined depending on whether the base voltage $V_a$ of the transistor 17 is higher or lower than the base voltage $V_b$ of the transistor 18. That is, when $V_a$ is higher than $V_b$, the transistor 17 is in an on state and the transistor 18 is in an off state so that the output voltage $V_0$ at the output terminal 4 becomes a high level ("1") and the output voltage $\overline{V}_0$ at the output terminal 3 becomes a low level ("0"). In contrast, when $V_a$ is lower than $V_b$, $V_0$ becomes "0" and $\overline{V}_0$ becomes "1".

According to the present invention, the base voltage $V_a$ is determined by an input-signal voltage $V_{i1}$ applied to the input terminal 1, the emitter voltage $V_c$ of the emitter-follower transistor 19, and the resistors 5 through 7. Similarly, the base voltage $V_b$ is determined by another input-signal voltage $V_{i2}$ applied to the input terminal 2, the emitter voltage $V_d$ of the emitter-follower transistor 21, and the resistors 8 through 10. Assume that the resistance of the resistors 5 through 10 are $R_5$ through $R_{10}$, respectively. Then the above-mentioned voltages $V_a$ and $V_b$ are expressed as follows:

$$V_a = V_{i1} \cdot \frac{R_6 R_7}{R_5 R_6 + R_6 R_7 + R_7 R_5} + V_c \cdot \frac{R_5 R_7}{R_5 R_6 + R_6 R_7 + R_7 R_5} \quad (1)$$

$$V_b = V_{i2} \cdot \frac{R_9 R_{10}}{R_8 R_9 + R_9 R_{10} + R_{10} R_8} + V_d \cdot \frac{R_8 R_{10}}{R_8 R_9 + R_9 R_{10} + R_{10} R_8} \quad (2)$$

Therefore, the voltages $V_a$ and $V_b$ can be controlled by controlling the emitter-follower output voltages $V_c$ and $V_d$, respectively. Since the voltages $V_c$ and $V_d$ are the output voltages of the emitter-follower transistors 19 and 21, they can be controlled by controlling the base voltages $V_e$ and $V_f$ applied to the bases of the emitter-follower transistors 19 and 21. Thus, the threshold voltage of the circuit of FIG. 1 can be made variable.

The control operation of the threshold voltage of the circuit of FIG. 1 is explained with reference to FIG. 2. For the sake of simplicity, the resistor network comprising the resistors 5 through 7 and the resistor network comprising the resistors 8 through 10 are assumed to be symmetrical, i.e., $R_5 = R_8$, $R_6 = R_9$, and $R_7 = R_{10}$.

Two modes of operation are possible, i.e., the mode when $V_e = V_f$ and the mode $V_e > V_f$ or $V_e < V_f$.

When $V_e = V_f$, the emitter voltages $V_c$ and $V_d$ of the transistors 19 and 21 are equal. In this case, since the resistor networks are symmetrical as mentioned above, the difference between $V_a$ and $V_b$, which determines the threshold voltage according to the present invention, depends on only the difference between the input-signal voltages $V_{i1}$ and $V_{i2}$, as can be seen from the above equations (1) and (2). As a result, as is illustrated in FIG. 2 by the broken curve A, the output voltage $V_0$ is "1" when $V_{i1}$ is higher than $V_{i2}$ and the output voltage $V_0$ is "0" when $V_{i1}$ is lower than $V_{i2}$. That is, in this case, the threshold voltage for providing output signals in response to differential input signals is 0 V, i.e., the input offset voltage is 0 V.

When $V_e$ is higher than $V_f$, $V_c$ becomes higher than $V_d$. As a result, the difference between $V_a$ and $V_b$ depends not only on the difference between the input-signal-voltages $V_{i1}$ and $V_{i2}$ but also on the difference between $V_c$ and $V_d$, as can be seen from the above equations (1) and (2). Thus, as is illustrated in FIG. 2 by the solid curve B, the threshold voltage for providing the output voltage $V_0$ is shifted to a voltage lower than 0 V. Similarly, when $V_e$ is lower than $V_f$, the threshold voltage for providing the output voltage $V_0$ is shifted to a voltage higher than 0 V, as is illustrated in FIG. 2 by the solid curve B'.

Accordingly, the threshold voltage of the circuit of FIG. 1 can be controlled by controlling the base voltages $V_e$ and $V_f$ applied to the bases of the emitter-follower-transistors 19 and 21.

It is, however, difficult to change the voltages $V_e$ and $V_f$ and, therefore, the voltages $V_c$ and $V_d$, in an analog fashion.

Figure 3:
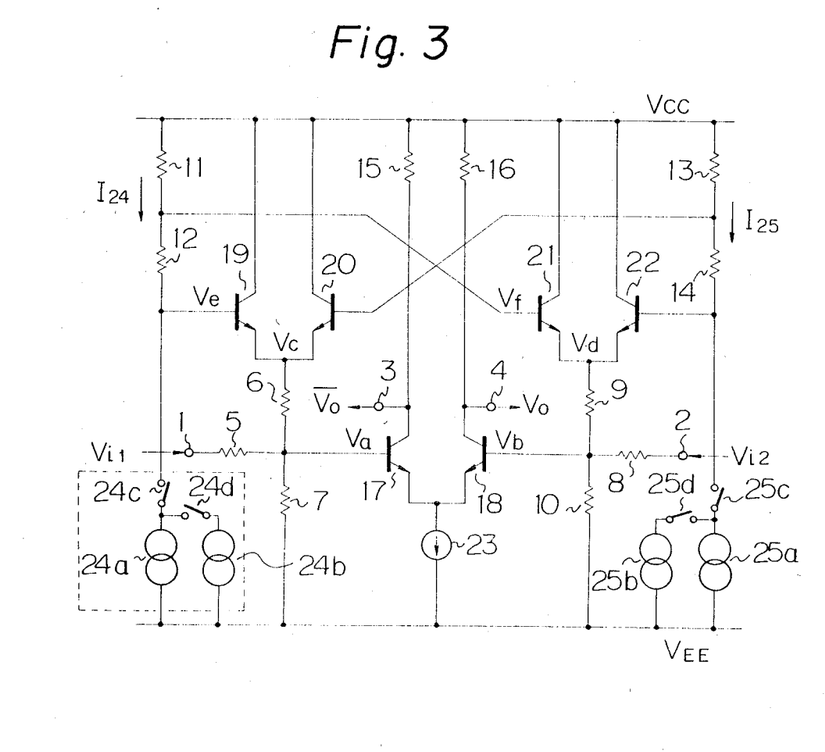
FIG. 3 is a circuit diagram of a second embodiment of the present invention.

FIG. 3 is a second embodiment of the present invention in which the voltages $V_c$ and $V_d$ can be changed digitally. In FIG. 3, and in the subsequent drawings, the same reference numerals as those used in FIG. 1 designate the same elements as those in FIG. 1. The difference between FIG. 1 and FIG. 3 is that in FIG. 3 an NPN transistor 20, an NPN transistor 22, resistors 11 through 14, constant-current sources 24a, 24b, 25a and 25b, and switches 24c, 24d, 25c and 25d are added. The resistiors 11 and 12, the switch 24c, and the constant-current source 24a are connected in series between the high-voltage power supply line $V_{CC}$ and the low-voltage power supply line $V_{EE}$, and the resistors 13 and 14, the switch 25c, and the constant-current source 25a are connected in series between the high-voltage-power supply line $V_{CC}$ and the low-voltage power supply line $V_{EE}$. The emitter of the transistor 20 is connected to the emitter of the transistor 19, and the emitter of the transistor 22 is connected to the emitter of the transistor 21. The collectors of the transistors 20 and 22 are connected to the high-voltage power supply line $V_{CC}$. The base of the transistor 20 is connected through the resistor 13 to the high-voltage power supply line $V_{CC}$, and the base of the transistor 21 is connected through the resistor 11 to the high-voltage power supply line $V_{CC}$. The base of the transistor 19 is connected through the resistors 12 and 11 to the high-voltage power supply line $V_{CC}$, and the base of the transistor 22 is connected through the resistors 14 and 13 to the high-voltage power supply line $V_{CC}$. The constant-current source 24b is connected in parallel to the constant-current-source 24a through the switch 24d, and the constant-current source 25b is connected in parallel to the constant-current source 25a through the switch 25d.

The control operation of the threshold voltage of the circuit of FIG. 3 will now be explained. Assume that the resistances of the resistors 11 through 14 are $R_{11}$ through $R_{14}$, respectively, and that $R_5 = R_8$, $R_6 = R_9$, $R_7 = R_{10}$, $R_{11} = R_{13}$, and $R_{12} = R_{14}$. Also, the constant-current sources 24a and 25a are assumed to be the same.

In the first mode, when the switch 25c is closed and the switch 24c is open, no current is conducted through the resistors 11 and 12 but a current is conducted through the resistors 13 and 14. As a result, no voltage drop is produced across the resistors 11 and 12 and therefore the transistors 19 and 21 receive a high power supply voltage (also referred to as $V_{CC}$) at their bases and the base voltages of the transistors 20 and 22 are lower than $V_{CC}$ due to a voltage drop across the resistors 13 and 14. Accordingly, the transistors 19 and 21 are turned on, and the transistors 20 and 22 are turned off. Therefore, in this case, the emitter voltages $V_c$ and $V_d$ of the transistors 19 and 21 become equal. Thus, the threshold characteristic of the circuit of FIG. 3 in this case is the same as that illustrated in FIG. 2 by the broken curve A, i.e., when $V_{i1}$ is higher than $V_{i2}$, the output voltage $V_0$ is "1" and when $V_{i1}$ is lower than $V_{i2}$, the output voltage $V_0$ is "0".

In the second mode, when both of the switches 24c and 25c are closed and when the switch 24d is closed and the switch 25d is open, the current $I_{24}$ conducted through the resistors 11 and 12 becomes much greater than the current $I_{25}$ conducted through the resistors 13 and 14. As a result, the transistors 19 and 21 are turned off and the transistors 20 and 22 are turned on. In this case, the voltages $V_c$ and $V_d$ are expressed as:

$$V_c = V_{CC} - (V_{13} + V_{BE})$$

$$V_d = V_{CC} - (V_{13} + V_{14} + V_{BE}),$$

where $V_{13}$ and $V_{14}$ are voltage drops across the resistors 13 and 14, respectively. Accordingly, in this case, the emitter voltage $V_c$ is higher than the emitter voltage $V_d$. The threshold characteristic in this case is similar to that shown in FIG. 2 by the solid curve B.

Figure 2:
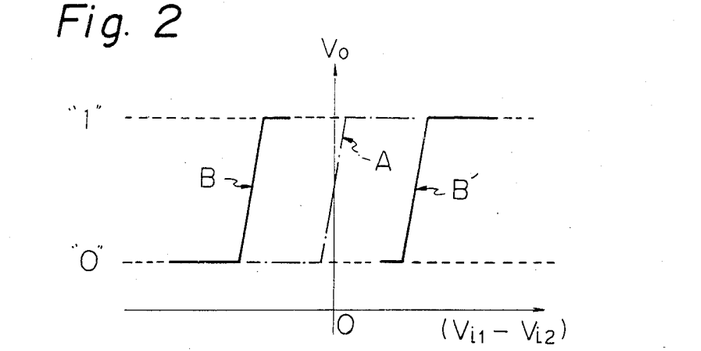
FIG. 2 is a transfer characteristic of the differential threshold voltage of the receiver of FIG. 1.

In the third mode, when both of the switches 24c and 25c are closed and when the switch 24d is open and the switch 25d is closed, the voltage $V_c$ is lower than the voltage $V_d$, resulting in a threshold characteristic similar to that shown in FIG. 2 by the solid curve B'.

Figure 4A:
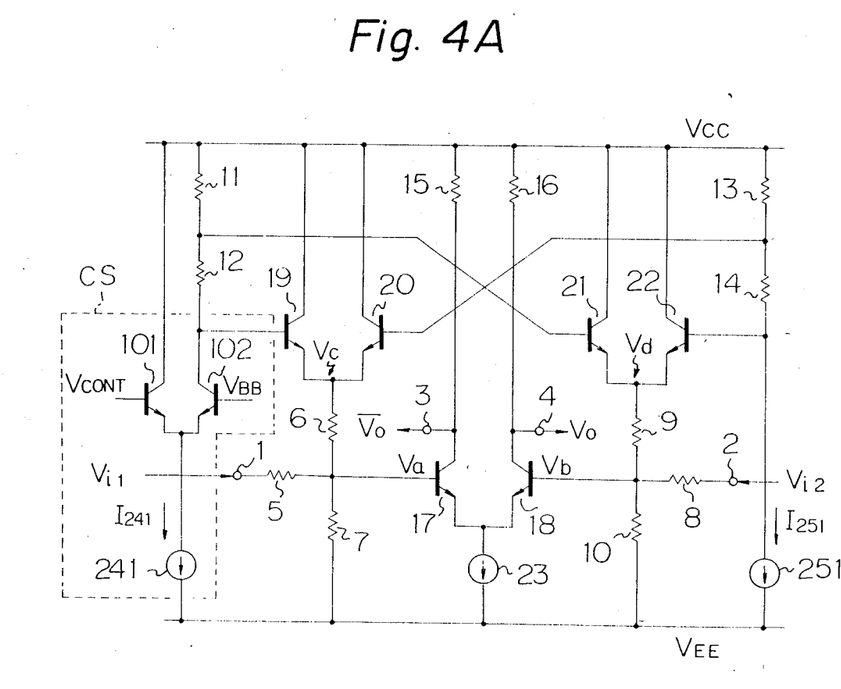
FIGS. 4A and 4B are circuit diagrams of a third embodiment of the present invention.

FIG. 4A is a third embodiment of the present invention. The difference between FIG. 3 and FIG. 4 is that in FIG. 4, in place of the constant-current-sources 24a, 24b, 25a and 25b and the switches 24c, 24d, 25c and 25d, an emitter-coupled logic circuit (usually referred to as an ECL circuit) including a current source 241, NPN transistors 101 and 102, and a current source 251 is employed. The collector of the transistor 101 is connected to the high-voltage power supply line $V_{CC}$, and the collector of the transistor 102 is connected through the resistors 12 and 11 to the high-voltage power supply line $V_{CC}$. The emitters of the transistors 101 and 102 are connected through the current source 241 to the low-voltage power supply line $V_{EE}$. The current source 251 is connected between the resistor 14 and the low-voltage power supply line $V_{EE}$. The NPN transistors 101 and 102 and the current source 241 form a well-known current switch CS of an ECL circuit. A reference voltage $V_{BB}$ is applied, to the base of the transistor 102 and a control voltage $V_{CONT}$ is applied to the base of the transistor 101.

When the control voltage $V_{CONT}$ is higher than the reference voltage $V_{BB}$, the transistor 101 is turned on and the transistor 102 is turned off, with the result that the current is conducted through the transistor 101. In this case, no voltage drop is produced across the resistors 11 and 12 and therefore the voltage $V_c$ is equal to the voltage $V_d$. In contrast, when the control voltage $V_{CONT}$ is lower than the reference voltage $V_{BB}$, the transistor 102 is turned on and the transistor 101 is turned off, with the result that a current flows through the resistors 11 and 12 and, consequently, a voltage drop occurs across the resistors 11 and 12. In this case, when the current $I_{241}$, flowing through the current source 241, is made much larger than the current $I_{251}$ flowing through the current source 251, the transistors 20 and 22 are turned on and the transistors 19 and 21 are turned off. Since the base voltage of the transistor 20 is higher than the base voltage of the transistor 22, the voltage $V_c$ becomes higher than the voltage $V_d$, resulting in a threshold characteristic with a negative input offset voltage similar to that illustrated by the said curve B in FIG. 2.

Figure 4B:
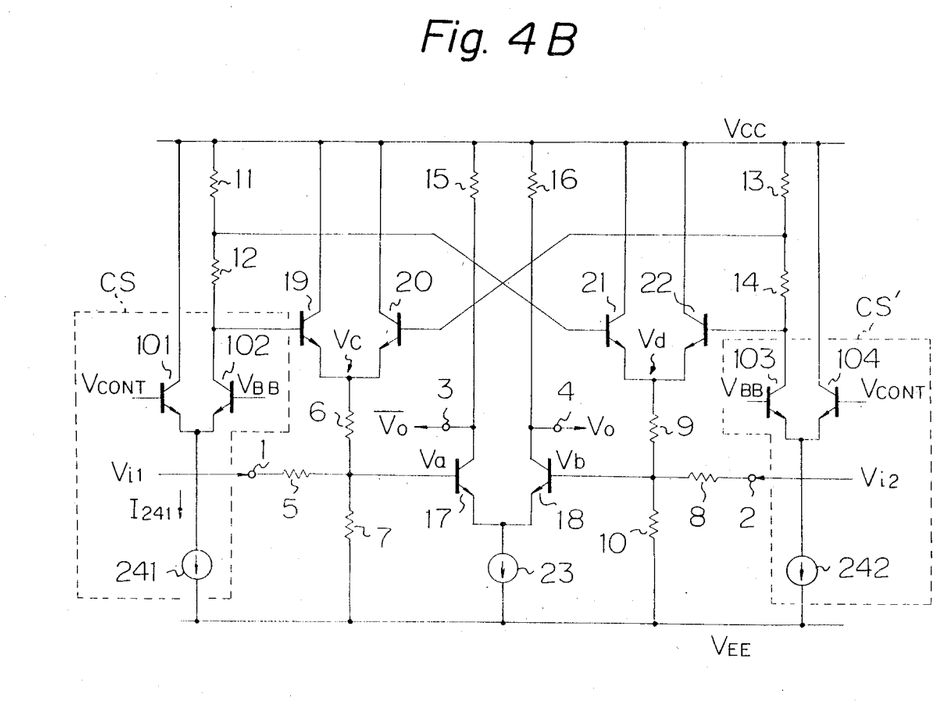

It will be apparent that, by providing a current switch CS' similar to the current switch CS on the right hand side of the receiver of FIG. 4A, as illustrated in FIG. 4B, or by determining the resistances of the resistors 11, 12, 13 and 14 to be appropriate values including 0Ω, the input offset voltage of the receiver of FIG. 4A can be made positive, negative, or 0 V. In FIG. 4B, the current switch CS' includes NPN transistors 103 and 104. The connecting relationship is similar to that in the current switch CS.

Figure 5:
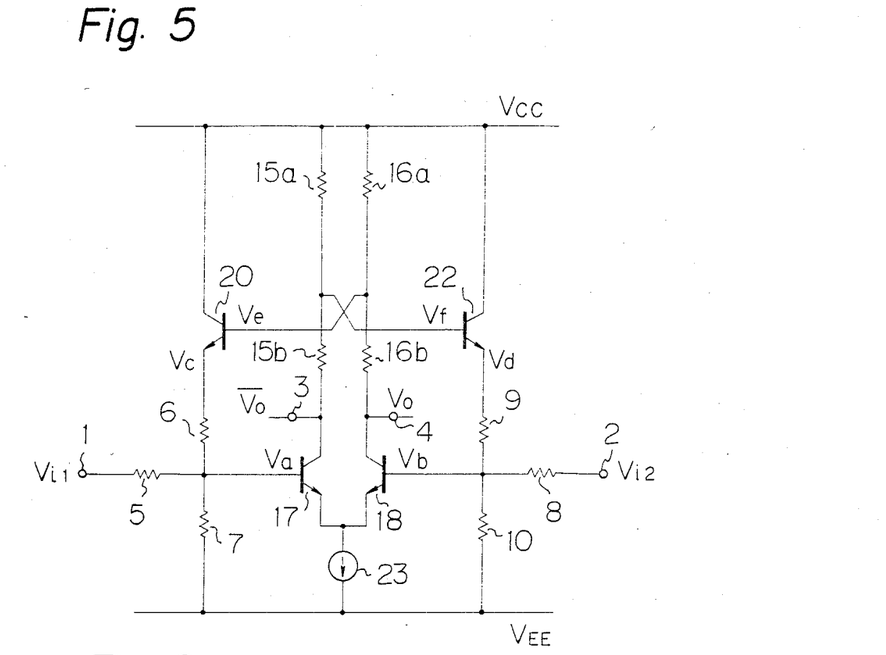
FIG. 5 is a circuit diagram of a fourth embodiment of the present invention.

FIG. 5 is a fourth embodiment of the present invention. The difference between FIG. 4 and FIG. 5 is that the transistors 19, 21, 101 and 102, the resistors 11 through 14, and the current sources 241 and 251 in FIG. 4 are eliminated in FIG. 5. In FIG. 5 in place of the above-mentioned elements, two series-connected-resistors 15a and 15b are connected between the high-voltage power supply line $V_{CC}$ and the collector of the transistor 17, and two series-connected resistors 16a and 16b are connected between the high-voltage power supply line $V_{CC}$ and the collector of the transistor 18. The base of the transistor 20 is connected to the connecting point between the resistors 16a and 16b, and the base of the transistor 22 is connected to the connecting point between the resistors 15a and 15b. The resistors 15a and 15b have the function of setting the low level of the output voltage $\overline{V}_0$ to a desired level, and the resistors 16a and 16b have the function of setting the low level of the output voltage $V_0$ to a desired level. By determining the resistances of the resistors 15a, 15b, 16a and 16b as desired values, the emitter-follower output voltages $V_c$ and $V_d$ can be appropriately determined.

Figure 6:
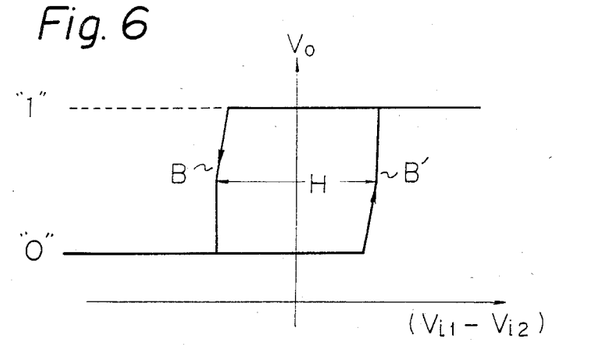
FIG. 6 is a transfer characteristic of the differential threshold voltage of the receiver of FIG. 5.

FIG. 6 shows the threshold characteristics of the receiver of FIG. 5. The operation of the receiver of FIG. 5 is as follows. When the base voltage $V_a$ of the transistor 17 becomes slightly lower than the base voltage $V_b$ of the transistor 18, the transistor 17 begins to turn off and the transistor 18 begins to turn on. Accordingly, the output voltage $\overline{V}_0$ at the output terminal 3 becomes higher than the output voltage $V_0$ at the output terminal 4. This causes the base voltage $V_e$ of the transistor 20 to be lower than the base voltage $V_f$ of the transistor 22. Accordingly, the emitter voltage $V_c$ of the transistor 20 becomes lower than the emitter voltage $V_d$ of the transistor 22. As a result, the base voltage $V_a$ becomes much lower than the base voltage $V_b$ due to the feedback effect. Therefore, the output voltage $V_0$ at the output terminal 4 is rapidly fixed to the "0" level, shown in FIG. 6 by the curve B. In contrast, when $V_a$ becomes slightly higher than $V_b$, the output voltage $V_0$ at the output terminal 4 is rapidly fixed to the "1" level. That is, the receiver of FIG. 5 has, as its threshold characteristics, an input hysteresis, shown by "H" in FIG. 6.

The advantage of such a hysteresis characteristic is that the receiver of FIG. 5 does not have the 0 V threshold shown in FIG. 2 by the broken curve A. When the receiver of FIG. 5 receives no signal, its outputs $V_0$ and $\overline{V}_0$ are fixed to "1" and "0" or "0" and "1", respectively, so that the output signals do not oscillate. Further, due to the feedback effect, the output voltages $V_0$ and $\overline{V}_0$ are rapidly fixed to "1" or "0" even when the input signal changes slowly.

Figure 7:
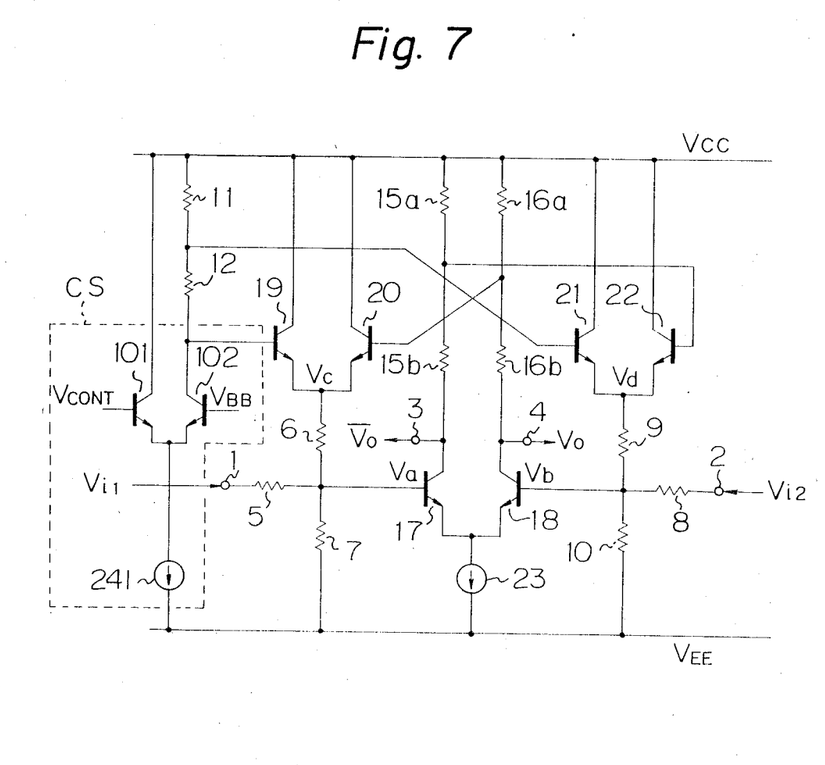
FIG. 7 is a circuit diagram of a fifth embodiment of the present invention.

FIG. 7 is a fifth embodiment of the present invention. The fifth embodiment of FIG. 7 is a combination of the third embodiment of FIG. 4 and the fourth embodiment of FIG. 5. That is, in addition to the circuit of FIG. 5, the current switch CS including the transistors 101 and 102 and the current source 241, the resistors 11 and 12, and the transistors 19 and 21 are provided. The base of the transistor 20 is connected to a connecting point between the resistors 16a and 16b, and the base of the transistor 22 is connected to a connecting point between the resistors 15a and 15b. Due to this construction, when the control voltage $V_{CONT}$ is lower than the reference voltage $V_{BB}$, the threshold characteristic B or B' in FIG. 6 can be selected, and when the control voltage $V_{CONT}$ is higher than the reference voltage $V_{BB}$, the threshold characteristic A in FIG. 2 can be selected. A control circuit (not shown) is provided. The control circuit detects the change in the output voltage $V_0$ of the circuit of FIG. 7 to provide the control voltage $V_{CONT}$. When the output voltage $V_0$ repeats between the H level and the L level, that is, when the circuit of FIG. 7 receives a valid signal, the control voltage $V_{CONT}$ is made to be the H level. When the output voltage $V_0$ does not change for a long time, that is, when the circuit of FIG. 7 does not receive a valid signal, the control voltage $V_{CONT}$ is made to be the L level. By means of this control voltage $V_{CONT}$ provided by the control circuit, the receiver of FIG. 7 can receive a valid signal, i.e. a less distorted signal, because, during this time, the threshold voltage is 0V. When the receiver of FIG. 7 receives no signal, that is, when the differential input voltage is 0V, it can provide a fixed H or L level signal so as to prevent troubles such as oscillation and so forth, because, during this time, the threshold voltage is not 0V.

In the foregoing embodiments, it will be easily understood that the current sources 23, 24a, 24b, 25a, 25b, 241 and 251 may be not only those formed with transistors but also those formed with resistors. Also, the switches 24c, 24d, 25c and 25d can be formed with transistors or with circuits including transistors, resistors, diodes, etc. Further, the present invention is not restricted to the foregoing embodiments and various other changes and modifications are possible without departing from the spirit of the present invention.

From the foregoing description, it will be apparent that, according to the present invention, a variable-threshold-type differential signal receiver which can output a fixed "1" or "0" level signal when it receives a zero-volts signal and which has a high noise margin by selecting a desired threshold voltage in response to the state of the input signal.

We claim:

1. A variable-threshold-type differential signal receiver operatively connected to receive input voltages and having a differential amplifier for comparing differential voltages of differential input signals with a predetermined threshold voltage so as to provide logical output signals, comprising:
    a first emitter follower operatively connected to receive the input voltage and providing an output;
    first impedance means comprising a resistor network, operatively connected to said first emitter follower, for superimposing the output of said first emitter follower on one of the received differential input signals, the predetermined threshold voltage being variably controlled by controlling the input voltage of said first emitter follower;
    said differential amplifier comprising:
    a first NPN transistor having a base operatively connected to receive a first differential input signal and having an emitter and a collector;
    a second NPN transistor having an emitter operatively connected to the emitter of said first NPN transistor, having a base operatively connected to receive a second differential input signal and having a collector, the output voltage of said first emitter follower and one of said first and second differential input signals being combined and voltage divided by said resistor network, the divided output voltage of said first emitter follower being applied to the base of one of said first and second NPN transistors;
    a first current source operatively connected between the emitters of said first and second NPN transistors and a low voltage power supply line;
    a first resistor operatively connected between the collector of said first NPN transistor and a high-voltage power supply line;
    a second resistor operatively connected between the collector of said second NPN transistor and said high-voltage power supply line; and
    at least one output terminal connected to the collector of one of said first and second NPN transistors, said output terminal being adapted to provide the logical output signals.

2. A variable-threshold-type differential signal receiver as set forth in claim 1, operatively connected to receive a first control voltage as the emitter follower input voltage, wherein said first impedance means includes a third resistor operatively connected to the base of said first NPN transistor, and wherein said first emitter follower comprises a third NPN transistor having a collector operatively connected to said high-voltage power supply line, having an emitter operatively connected to said third resistor, and having a base operatively connected to receive the first control voltage.

3. A variable-threshold-type differential signal receiver as set forth in claim 2, further comprising a first input terminal, wherein said first impedance means comprises:
    said third resistor;
    a fourth resistor operatively connected between said first input terminal of said variable-threshold-type differential receiver and the base of said first NPN transistor; and
    a fifth resistor operatively connected between the base of said first NPN transistor and the low-voltage power supply line.

4. A variable-threshold-type differential signal receiver as set forth in claim 3, further comprising a second input terminal operatively connected to receive a second control voltage, further comprising:
    a sixth resistor operatively connected to the base of said second NPN transistor;
    a second emitter follower operatively connected to said second NPN transistor and comprising a fourth NPN transistor having a collector operatively connected to the high-voltage power supply line, having an emitter operatively connected to said sixth resistor, and having a base operatively connected to receive the second control voltage; and
    a second impedance means operatively connected to said second emitter follower, comprising:
    said sixth resistor;

a seventh resistor operatively connected between said second input terminal of said variable-threshold-type differential receiver and the base of said second NPN transistor; and an eighth resistor operatively connected between the base of said second NPN transistor and the low-voltage power supply line.

5. A variable-threshold-type differential signal receiver as set forth in claim 4, further comprising:

fifth and sixth NPN transistors;

said fifth NPN transistor having a collector operatively connected to the high-voltage power supply line, having an emitter operatively connected to the emitter of said third NPN transistor, and having a base;

a ninth resistor operatively connected between the base of said third NPN transistor and the base of said sixth transistor;

a tenth resistor operatively connected in series between said ninth resistor and said high-voltage power supply line;

a second current source operatively connected between the base of said third NPN transistor and the low-voltage power supply line;

said sixth NPN transistor having a collector operatively connected to the high-voltage power supply line, having an emitter operatively connected to the emitter of said fourth NPN transistor, and having a base;

an eleventh resistor operatively connected between the base of said fourth NPN transistor and the base of said fifth NPN transistor;

a twelfth resistor operatively connected in series between said eleventh resistor and said high-voltage power supply line; and a third current source operatively connected between the base of said fourth NPN transistor and the low-voltage power supply line;

the base of said fifth NPN transistor being connected to a connecting point between said eleventh and twelfth resistors and the base of said sixth NPN transistor being connected to a connecting point between said ninth and tenth resistors, whereby, by varying the current flowing through said second current source or through said third current source, the predetermined threshold voltage can be controlled.

6. A variable-threshold-type differential signal receiver as set forth in claim 4, further comprising:

fifth and sixth NPN transistors;

said fifth NPN transistor having a collector operatively connected to said high-voltage power supply line, having an emitter operatively connected to the emitter of said third NPN transistor, and having a base;

a ninth resistor operatively connected between the base of said third NPN transistor and the base of said sixth transistor;

a tenth resistor operatively connected in series between said ninth resistor and the high-voltage power supply line;

said sixth NPN transistor having a collector operatively connected to the high-voltage power supply line, having an emitter operatively connected to the emitter of said fourth NPN transistor, and having a base;

an eleventh resistor, operatively connected between the base of said fourth NPN transistor and the base of said fifth NPN transistor;

a twelfth resistor operatively connected in series between said eleventh transistor and the high-voltage power supply line;

a first current switch operatively connected between the base of said fourth NPN transistor and the low-voltage power supply line; and a second current source operatively connected between the base of said third NPN transistor and the low-voltage power supply line.

7. A variable-threshold-type differential signal receiver as set forth in claim 6, wherein said first current switch comprises:

a seventh NPN transistor having a collector operatively connected to the base of said third NPN transistor, having a base operatively connected to receive a reference voltage and having an emitter;

an eighth NPN transistor having an emitter operatively connected to the emitter of said seventh NPN transistor, having a collector operatively connected to the high-voltage power supply line, and having a base operatively connected to receive the first control voltage; and a third current source operatively connected between the emitters of said seventh and eighth NPN transistors and the low-voltage power supply line.

8. A variable-threshold-type differential signal receiver as set forth in claim 7, operatively connected to receive said reference voltage and a second control voltage, further comprising:

a second current switch operatively connected between the base of said fourth NPN transistor and the low-voltage power supply line, said second current switch comprising:

a ninth transistor having a collector operatively connected to the base of said fourth transistor, having a base operatively connected to receive said reference voltage and having an emitter; and a tenth NPN transistor having an emitter operatively connected to the emitter of said ninth transistor, having a collector operatively connected to the high-voltage power supply line and having a base operatively connected to receive the second control voltage, said second current source being connected between the emitters of said ninth and tenth NPN transistors and the low-voltage power supply line.

9. A variable-threshold-type differential signal receiver as set forth in claim 4, wherein said first resistor comprises at least two resistors connected in series and said second resistor comprises at least two resistors connected in series, the base of said third NPN transistor being connected to a connecting point between said at least two resistors of said second resistor and the base of said fourth NPN transistor being connected to a connecting point between said at least two resistors of said first resistor, said connecting points representing the voltage potential of said first and second control voltage.

10. A variable-threshold-type differential signal receiver as set forth in claim 4, further comprising:

a fifth NPN transistor having a collector operatively connected to the high-voltage power supply line, having an emitter operatively connected to the emitter of said third NPN transistor, and having a base;

a ninth resistor operatively connected between the base of said third NPN transistor and the base of said fourth NPN transistor;

a tenth resistor operatively connected in series between said ninth resistor and the high-voltage power supply line;

a sixth NPN transistor having a collector operatively connected to the high-voltage power supply line, having an emitter operatively connected to the emitter of said fourth NPN transistor and having a base;

a first current switch operatively connected between the base of said third NPN transistor and the low-voltage power supply line;

said first resistor comprising at least two resistors operatively connected in series and said second resistor comprising at least two resistors operatively connected in series, the base of said fifth NPN transistor operatively connected to a connecting point between said at least two resistors of said second resistor and the base of said sixth NPN transistor operatively connected to a connecting point between said at least two resistors of said first resistor.

* * * * *

UNITED STATES PATENT AND TRADEMARK OFFICE
CERTIFICATE OF CORRECTION

PATENT NO. : 4,587,444
DATED      : MAY 6, 1986
INVENTOR(S): SHINJI EMORI ET AL.

It is certified that error appears in the above-identified patent and that said Letters Patent is hereby corrected as shown below:

Col. 1, line 22, "ae" should be --are--.

Col. 2, line 2, "said" should be --solid--.

Signed and Sealed this

Fifteenth Day of July 1986

[SEAL]

Attest:

DONALD J. QUIGG

Attesting Officer

Commissioner of Patents and Trademarks